(12) United States Patent
Hur et al.

(10) Patent No.: US 8,698,158 B2
(45) Date of Patent: Apr. 15, 2014

(54) DISPLAY SUBSTRATE, METHOD OF MANUFACTURING THE SAME, AND DISPLAY APPARATUS HAVING THE SAME

(75) Inventors: Myung-Koo Hur, Asan-si (KR); Sang-Gun Choi, Asan-si (KR)

(73) Assignee: Samsung Display Co., Ltd., Yongin (KR)

( * ) Notice: Subject to any disclaimer, the term of this patent is extended or adjusted under 35 U.S.C. 154(b) by 642 days.

(21) Appl. No.: 12/893,423

(22) Filed: Sep. 29, 2010

(65) Prior Publication Data

US 2011/0089424 A1 Apr. 21, 2011

(30) Foreign Application Priority Data

Oct. 21, 2009 (KR) .................. 10-2009-0100164

(51) Int. Cl.
*H01L 27/14* (2006.01)

(52) U.S. Cl.
USPC .......... 257/72; 257/59; 257/E27.131; 349/38; 438/149; 438/151

(58) Field of Classification Search
None
See application file for complete search history.

(56) References Cited

U.S. PATENT DOCUMENTS

2008/0017886 A1* 1/2008 Chang ..................... 257/203
2008/0068550 A1* 3/2008 Chang et al. ............. 349/143

* cited by examiner

*Primary Examiner* — Tan N Tran
*Assistant Examiner* — Scott R Wilson
(74) *Attorney, Agent, or Firm* — H.C. Park & Associates, PLC

(57) ABSTRACT

A display substrate includes a pixel electrode, an m-th data line ('m' is a natural number), a floating electrode, a (m+1)-th data line and a storage electrode. The pixel electrode is disposed in a pixel area of the substrate. The m-th data line is disposed at a first side of the pixel electrode and electrically connected to the pixel electrode. The floating electrode partially overlaps with the m-th data line. The (m+1)-th data line is disposed at a second side of the pixel electrode. The storage electrode is spaced apart from the (m+1)-th data line.

23 Claims, 15 Drawing Sheets

DISPLAY SUBSTRATE, METHOD OF MANUFACTURING THE SAME, AND DISPLAY APPARATUS HAVING THE SAME

CROSS REFERENCE TO RELATED APPLICATION

This application claims priority from and the benefit of Korean Patent Application No. 10-2009-0100164, filed on Oct. 21, 2009, which is hereby incorporated by reference for all purposes as if fully set forth herein.

BACKGROUND OF THE INVENTION

1. Field of the Invention

Exemplary embodiments of the present invention relate to a display substrate, a method of manufacturing the display substrate, and a display apparatus including the display substrate. More particularly, exemplary embodiments of the present invention relate to a display substrate with an improved display quality, a method of manufacturing the display substrate, and a display apparatus having the display substrate.

2. Discussion of the Background

Generally, a liquid crystal display (LCD) apparatus includes an LCD panel and a backlight supplying light to the LCD panel. The LCD panel may include an array substrate, a color filter substrate facing the array substrate and a liquid crystal layer disposed between the array substrate and the color filter substrate. A plurality of thin-film transistors may be disposed on the array substrate. The color filter may be formed on the color filter substrate. The LCD apparatus may display a grayscale using a light transmittance in accordance with an arrangement change of a liquid crystal.

For example, the array substrate may include a data line, a gate line and a pixel electrode. The data line and the gate line are electrically connected to the thin-film transistor. The pixel electrode is disposed in a pixel area and electrically connected to the thin-film transistor. The pixel electrode is a first electrode of a liquid crystal capacitor. The color filter substrate may include a common electrode that is a second electrode of the liquid crystal capacitor. An arrangement of the liquid crystal disposed between the pixel electrode and the common electrode changes by the intensity of an electric field formed by the pixel electrode and the common electrode.

A coupling capacitance may be generated between a data line and an adjacent pixel electrode that receives a voltage different from that of the data line, and the coupling capacitance may generate a display defect such as a color shift.

In addition, in the LCD apparatus, the light passing through the liquid crystal layer may be perceived differently at a side or a front of the LCD apparatus in accordance with a viewing angle. For example, in an area where the pixel electrode and the data electrode are adjacent to each other, a light leakage may occur according to the viewing angle, and thus the display defect may be generated.

SUMMARY OF THE INVENTION

Exemplary embodiments of the present invention provide a display substrate capable of high display quality.

Exemplary embodiments of the present invention also provide a method of manufacturing the display substrate.

Exemplary embodiments of the present invention also provide a display apparatus including the display substrate.

Additional features of the invention will be set forth in the description which follows, and in part will be apparent from the description, or may be learned by practice of the invention.

An exemplary embodiment of the present invention discloses a display substrate including a pixel electrode disposed in a pixel area on a substrate, a first data line disposed at a first side of the pixel electrode and electrically connected to the pixel electrode, a floating electrode partially overlapped by the first data line, a second data line disposed at a second side of the pixel electrode, and a storage electrode overlapping the pixel electrode and spaced apart from the second data line.

An exemplary embodiment of the present invention also discloses a method for manufacturing a display substrate, the method including forming a first conductive pattern in a pixel area on a substrate, the first conductive pattern including a floating electrode and a storage electrode, forming a second conductive pattern on the substrate where the first conductive pattern is formed, the second conductive pattern including a first data line partially overlapping the floating electrode and a second data line spaced apart from the storage electrode, and forming a pixel electrode in the pixel area on the substrate where the second conductive pattern is formed, the pixel electrode being electrically connected to the first data line.

An exemplary embodiment of the present invention also discloses a display apparatus including a display substrate and an opposite substrate facing the display substrate and comprising a common electrode, the display substrate including a pixel electrode disposed in a pixel area on a substrate, a first data line disposed at a first side of the pixel electrode and electrically connected to the pixel electrode, a floating electrode partially overlapped by the first data line, the floating electrode being electrically floated, a second data line disposed at a second side of the pixel electrode, and a storage electrode overlapping the pixel electrode and spaced apart from the second data line, wherein the storage electrode is configured to receive voltage, and an opposite substrate facing the display substrate and comprising a common electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
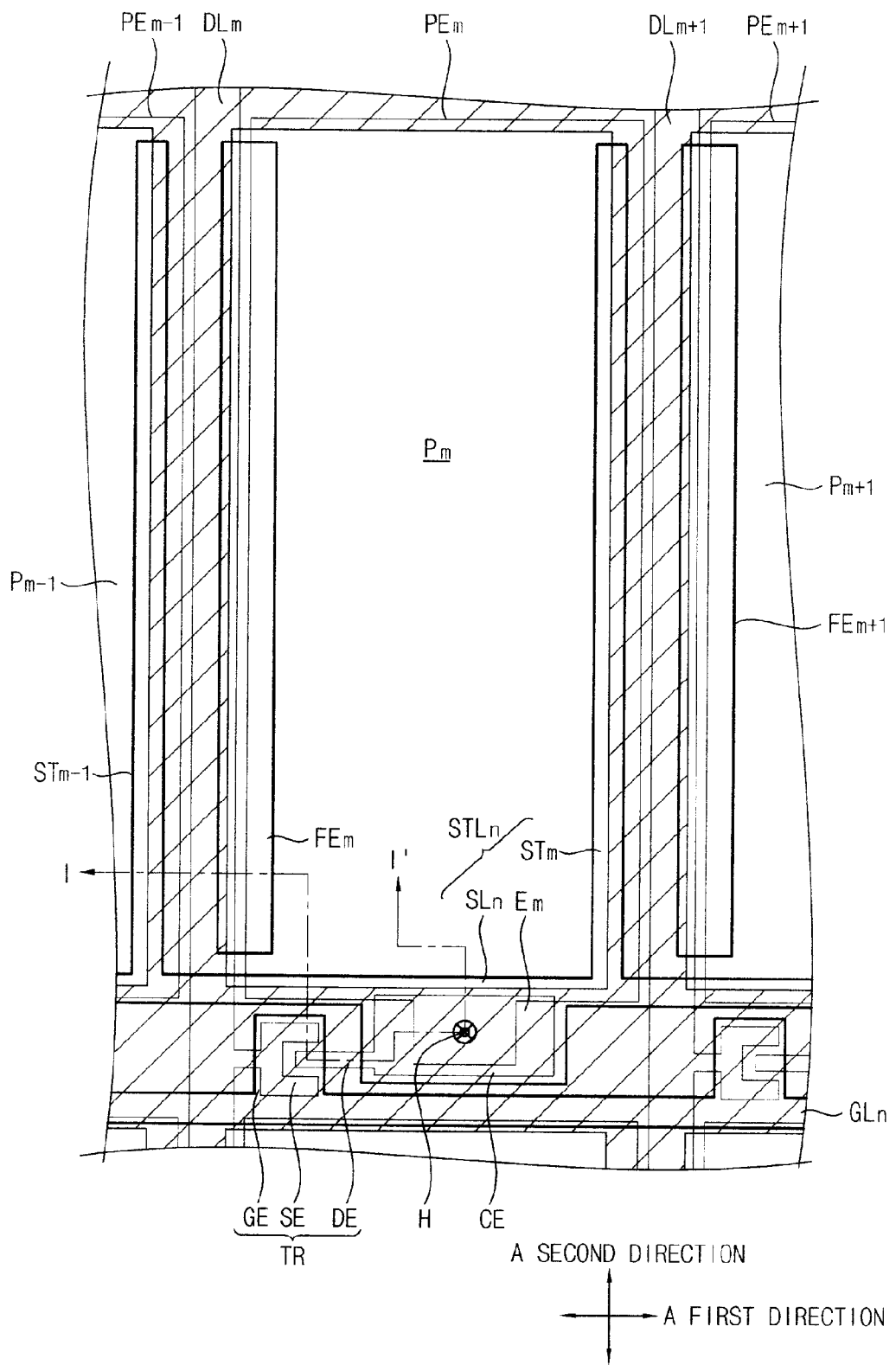
FIG. 1 is a plan view illustrating a display apparatus according to an exemplary embodiment of the present invention.

The invention is described more fully hereinafter with reference to the accompanying drawings, in which exemplary embodiments of the invention are shown. This invention may, however, be embodied in many different forms and should not be construed as limited to the embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers, and/or sections, these elements, components, regions, layers, and/or sections are not limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present invention.

Spatially relative terms, such as "beneath," "below," "lower," "above," "upper" and the like, may be used herein for ease of description to describe the relationship of one element or feature to another element(s) or feature(s) as illustrated in the figures. It will be understood that the spatially relative terms are intended to encompass different orientations of the apparatus in use or operation in addition to the orientation depicted in the figures. For example, if the apparatus in the figures is turned over, elements described as "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein interpreted accordingly.

The terminology used herein is for the purpose of describing particular exemplary embodiments and is not intended to limit the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments of the present invention are described herein with reference to cross-sectional illustrations that are schematic illustrations of idealized exemplary embodiments (and intermediate structures) of the present invention. As such, variations from the shapes of the illustrations as a result, for example, of manufacturing techniques and/or tolerances, are to be expected. Thus, the present invention should not be construed as limited to the particular shapes of regions illustrated herein but may include deviations in shapes that result, for example, from manufacturing. Thus, the regions illustrated in the figures are schematic in nature and their shapes are not intended to illustrate the actual shape of a region of an apparatus and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Figure 2:
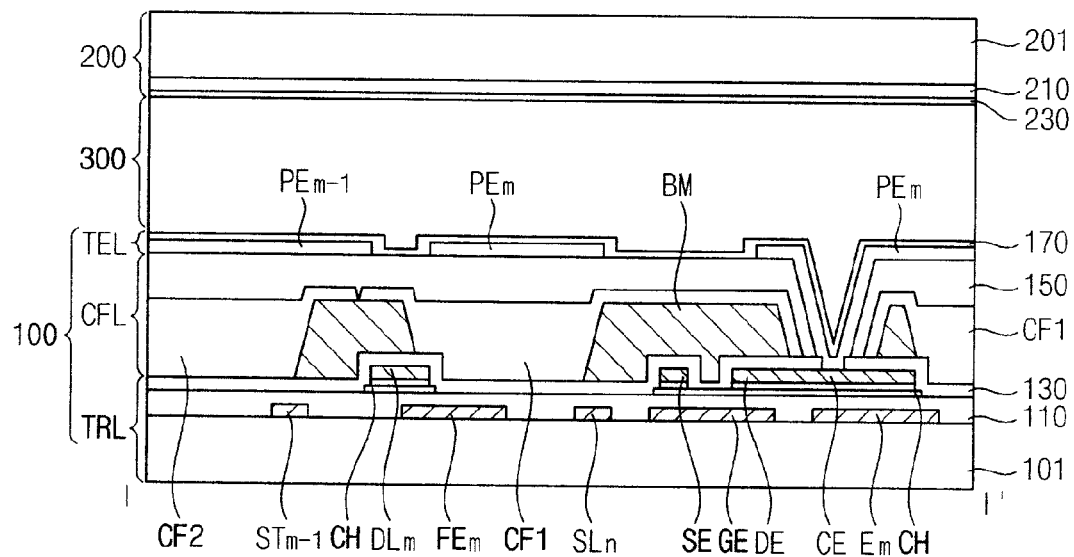
FIG. 2 is a cross-sectional view taken along line I-I' of FIG. 1.

FIG. 1 is a plan view illustrating a display apparatus according to an exemplary embodiment of the present invention. FIG. 2 is a cross-sectional view taken along line I-I' of FIG. 1.

Referring to FIG. 1 and FIG. 2, the display apparatus 500A includes a display substrate 100, an opposite substrate 200, and a liquid crystal layer 300.

The display substrate 100 includes a first substrate 101, a transistor layer TRL, a color filter layer CFL and a transparent electrode layer TEL.

The transistor layer TRL includes a first conductive pattern, an insulating layer 110, a second conductive pattern and a protection layer 130. The insulating layer 110 and the protection layer 130 may include an organic material or an inorganic material. Alternatively, the insulating layer 110 and the protection layer 130 may be made of multiple layers that include organic and inorganic materials.

The first conductive pattern includes an n-th gate line GLn, an n-th storage electrode line STLn and an m-th floating electrode FEm disposed on the first substrate 101 ('m' and 'n' are natural numbers).

The n-th gate line GLn extends along a first direction and includes a plurality of gate electrodes. For example, the n-th gate line GLn includes a gate electrode GE disposed in an m-th pixel area Pm.

The n-th storage electrode line STLn includes an n-th storage line SLn extending along the first direction, a plurality of storage electrodes connected to the n-th storage line SLn and a plurality of protruding electrodes connected to the n-th storage line SLn. The n-th storage electrode line STLn receives a storage common voltage.

The storage electrodes may be disposed adjacent to the data lines and substantially parallel with the data lines. The plurality of protruding electrodes may be disposed adjacent to the plurality of gate electrodes.

For example, an m-th storage electrode STm is connected to the n-th storage line SLn and disposed in an m-th pixel area Pm adjacent to and substantially parallel with a (m+1)-th data line DLm+1. An m-th protruding electrode Em is connected to the n-th storage line SLn and disposed in the m-th pixel area Pm adjacent to the gate electrode GE. The m-th storage electrode STm is a common electrode of a storage capacitor defined in the m-th pixel area Pm, and additionally may block the light leaked to an area adjacent to the (m+1)-th data line DLm+1.

The m-th floating electrode FEm is partially overlapped by the m-th data line DLm and disposed to be substantially parallel with the m-th data line DLm. The m-th floating electrode FEm is electrically floated and may block the light leaked to an area adjacent to the m-th data line DLm. A width of the m-th floating electrode FEm may be larger than that of the m-th storage electrode STm. The m-th floating electrode FEm is spaced apart from a (m−1)-th storage electrode STm−1.

The insulating layer 110 is disposed on the first substrate 101 on which the first conductive pattern is disposed, so as to cover the first conductive pattern.

The second conductive pattern includes the m-th data line DLm, a contact electrode CE and a (m+1)-th data line DLm+1.

The m-th data line DLm extends along a second direction crossing the first direction and includes a plurality of source electrodes. For example, the m-th data line DLm is spaced apart from the (m−1)-th storage electrode STm−1 and is disposed in an area partially overlapping with the m-th floating electrode FEm. The m-th data line DLm may include a source electrode SE disposed in the m-th pixel area Pm. The contact electrode CE is disposed in an area where the m-th protruding electrode Em is disposed and overlaps with the m-th protruding electrode Em. The contact electrode CE includes a drain electrode DE disposed in an area spaced apart from the source electrode SE.

The (m+1)-th data line DLm+1 faces the m-th data line DLm. The m-th pixel area Pm is disposed between the (m+1)-th data line DLm+1 and the m-th data line DLm. The (m+1)-th data line DLm+1 may include a plurality of source electrodes.

The second conductive pattern having the m-th data line DLm, the contact electrode CE and the (m+1)-th data line DLm+1 may further include a channel pattern CH disposed under the second conductive pattern. The channel pattern CH may include a semiconductor layer and an ohmic contact layer.

A transistor TR connected to the n-th gate line GLn and the m-th data line DLm may be defined by the gate electrode GE, the source electrode SE, the drain electrode DE and the channel pattern CH. A storage capacitor in the m-th pixel area Pm may be defined by the m-th protruding electrode Em, the insulating layer 110 and the contact electrode CE.

The protection layer 130 is disposed to cover the second conductive pattern on the first substrate 101 on which the second conductive pattern is disposed.

The color filter layer CFL includes a light blocking pattern BM, a plurality of color filters, including first color filter CF1, second color filter CF2, and third color filter CF3 (shown in FIG. 5B), and an overcoating layer 150. The color filter layer CFL may omit an overcoating layer 150.

The light blocking pattern BM may be disposed in an area where the first and second conductive patterns are disposed. For example, the light blocking pattern BM is disposed corresponding to an area where the n-th gate line GLn, the n-th storage electrode line STLn, the m-th data line DLm, the contact electrode CE, and the (m+1)-th data line DLm+1 are disposed.

The first color filter CF1, second color filter CF2, and third color filter CF3 are each disposed in an area between adjacent data lines. For example, a first color filter CF1 is disposed in an area between the m-th data line DLm and the (m+1)-th data line DLm+1, a second color filter CF2 is disposed in an area between the m-th data line DLm and the (m−1)-th data line (not shown), and a third color filter CF3 is disposed in an area between the (m+1)-th data line DLm+1 and the (m+2)-th data line (not shown). Therefore, the first color filter CF1 may be disposed in the m-th pixel area Pm, the second color filter CF2 may be disposed in a (m−1)-th pixel area Pm−1, and the third color filter CF3 may be disposed in a (m+1)-th pixel area Pm+1.

The overcoating layer 150 is disposed to cover the light blocking pattern BM and the first color filter CF1, the second color filter CF2, and the third color filter CF3 on the first substrate 101, so that the display substrate 100 is planarized.

The transparent electrode layer TEL includes a plurality of pixel electrodes and a first alignment layer 170.

For example, an m-th pixel electrode PEm may be disposed in the m-th pixel area Pm corresponding to the n-th gate line GLn, an m-th data line DLm, and a (m+1)-th data line DLm+1. A (m−1)-th pixel electrode PEm−1 may be disposed in the (m−1)-th pixel area Pm−1 corresponding to the n-th gate line GLn, a (m−1)-th data line (not shown) and an m-th data line DLm. A (m+1)-th pixel electrode PEm+1 may be disposed in a (m+1)-th pixel area Pm+1 corresponding to the n-th gate line GLn, the (m+1)-th data line DLm+1 and the (m+2)-th data line (not shown).

The m-th pixel electrode PEm is electrically connected through an opening H to a transistor TR, which is connected to the n-th gate line GLn and the m-th data line DLm. The m-th pixel electrode PEm is disposed to overlap with the m-th storage electrode STm. The m-th pixel electrode PEm and the m-th storage electrode STm may define a storage capacitor of the m-th pixel area Pm.

The first alignment layer 170 is disposed to cover (m−1)-th pixel electrode PEm−1, m-th pixel electrode PEm, and (m+1)-th pixel electrode PEm+1 on the first substrate 101. The first alignment layer 170 initially arranges liquid crystal of a liquid crystal layer 300.

The opposite substrate 200 includes a second substrate 201, a common electrode 210 and a second alignment layer 230. The common electrode 210 is disposed on the second substrate 201, and may define a liquid crystal capacitor with the liquid crystal layer 300 and each of (m−1)-th pixel electrode PEm−1, m-th pixel electrode PEm, and (m+1)-th pixel electrode PEm+1. The second alignment layer 230 is disposed on the common electrode 210 and initially arranges liquid crystal of the liquid crystal layer 300.

Hereinafter, referring to FIG. 3A, FIG. 3B, FIG. 4A, FIG. 4B, FIG. 5A, FIG. 5B, FIG. 6A, FIG. 6B, FIG. 7A, and FIG. 7B, a method of manufacturing the display substrate 100 is described.

Figure 3A:
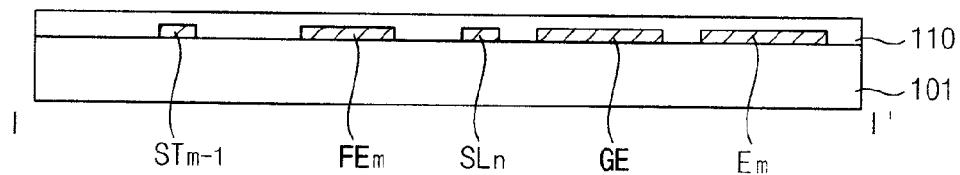
FIG. 3A and FIG. 3B are, respectively, a cross-sectional view and a plan view, depicting a method of forming a first conductive pattern of a display substrate of FIG. 2.
Figure 3B:
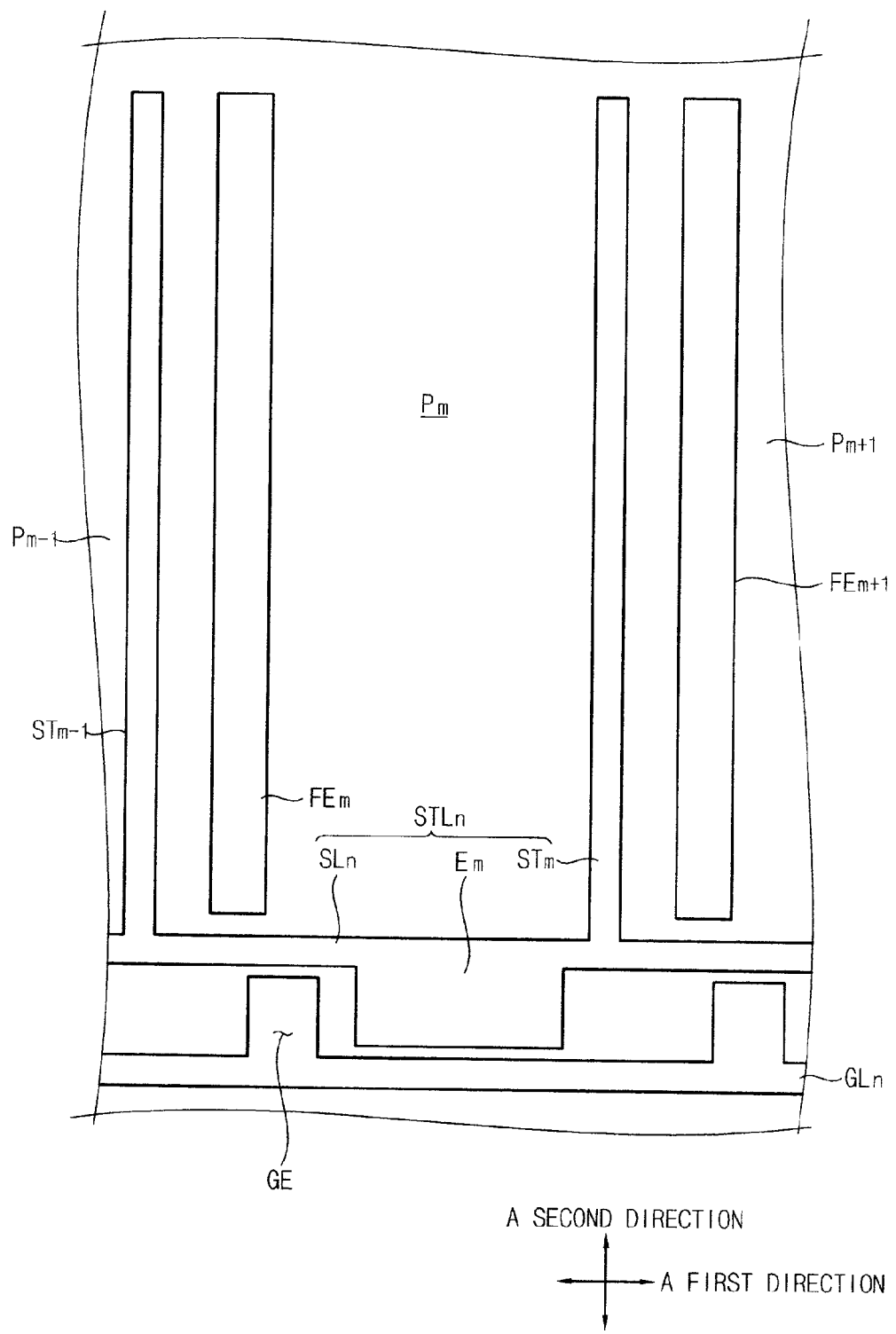

FIG. 3A and FIG. 3B are, respectively, a cross-sectional view and a plan view, depicting a method of forming a first conductive pattern of the display substrate of FIG. 2.

Referring to FIG. 2, FIG. 3A, and FIG. 3B, a first conductive layer is formed on the first substrate 101, and the first conductive layer is patterned to form a first conductive pattern. The first conductive pattern includes an n-th gate line GLn, an n-th storage electrode line STLn and an m-th floating electrode FEm.

The n-th gate line GLn extends along a first direction and includes a gate electrode GE. The n-th storage electrode line STLn includes an n-th storage line SLn extending along the first direction, an m-th storage electrode STm connected to the n-th storage line SLn and extending along a second direction crossing the first direction, and an m-th protruding electrode Em connected to the n-th storage line SLn and adjacent to the gate electrode GE. The n-th storage electrode line STLn receives a storage common voltage.

The m-th floating electrode FEm is spaced apart from the m-th storage electrode STm. The m-th floating electrode FEm blocks a light leakage. A width of the m-th floating electrode FEm may be larger than that of the m-th storage electrode STm.

The insulating layer 110 is formed on the first substrate 101 on which the first conductive pattern is formed.

Figure 4A:
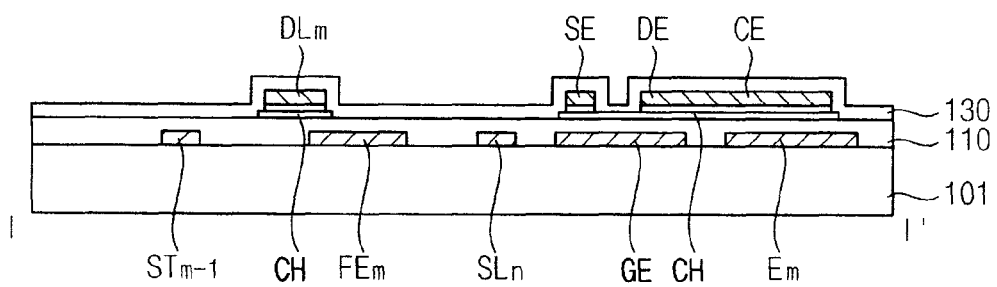
FIG. 4A and FIG. 4B are, respectively, a cross-sectional view and a plan view, depicting a method of forming a second conductive pattern of the display substrate of FIG. 2.
Figure 4B:
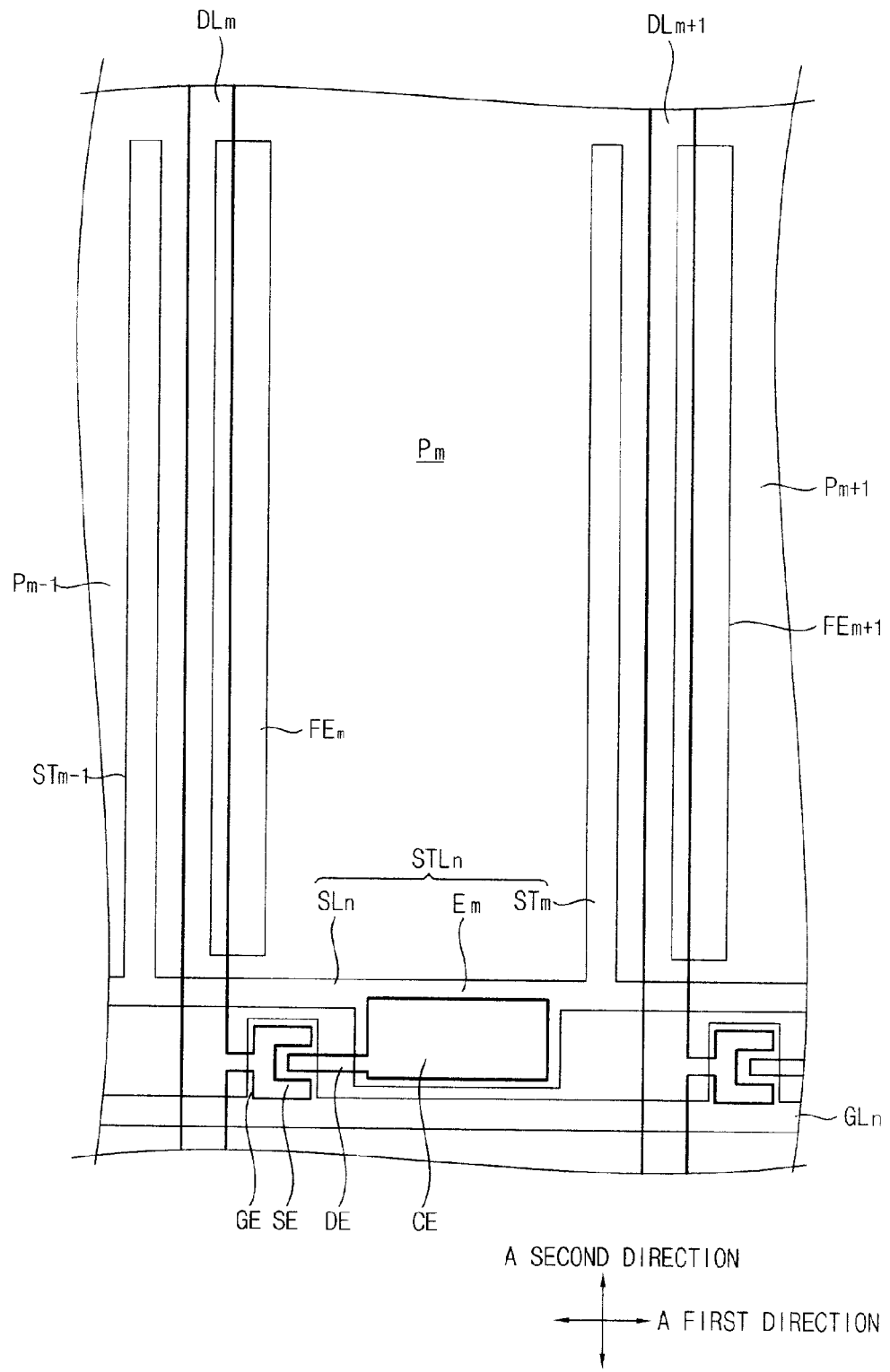

FIG. 4A and FIG. 4B are, respectively, a cross-sectional view and a plan view, depicting a method of forming a second conductive pattern of the display substrate of FIG. 2.

Referring to FIG. 2, FIG. 4A, and FIG. 4B, a channel layer and a second conductive layer are formed on the insulating layer 110. The channel layer may include a semiconductor layer and an ohmic contact layer. The channel layer and the second conductive layer are pattered using the same mask at the same time, so as to form a second conductive pattern.

The second conductive pattern has a double layer structure including the second conductive layer and the channel layer, and includes an m-th data line DLm, a contact electrode CE and a (m+1)-th data line DLm+1. Each of the m-th data line DLm, the contact electrode CE, and the (m+1)-th data line DLm+1 includes the channel pattern CH.

The m-th data line DLm extends along the second direction and includes a source electrode SE. The m-th data line DLm is spaced apart from the m-th storage electrode STm and is formed in an area partially overlapping with the m-th floating electrode FEm. Therefore, the m-th floating electrode FEm may block the light leaked from an area adjacent to the m-th data line DLm. The source electrode SE is formed on the gate electrode GE.

The contact electrode CE partially overlaps with the m-th protruding electrode Em. The contact electrode CE includes a drain electrode DE formed on the gate electrode GE. The drain electrode DE is spaced apart from the source electrode SE and exposes the channel pattern CH.

The (m+1)-th data line DLm+1 faces the m-th data line DLm and includes a plurality of source electrodes.

A transistor TR connected to the n-th gate line GLn and the m-th data line DLm may be defined by the gate electrode GE, the source electrode SE, the drain electrode DE and the channel pattern CH. A storage capacitor of an m-th pixel area Pm may be defined by the m-th protruding electrode Em, the insulating layer 110 and the contact electrode CE.

The protection layer 130 is formed on the first substrate 101 on which the second conductive pattern is formed. The protection layer 130 may include an organic material or an inorganic material. Alternatively, the protection layer 130 may be made of multiple layers that include organic and inorganic materials. Therefore, the transistor layer TRL is formed on the first substrate 101.

In the present exemplary embodiment, the channel layer and the second conductive layer are patterned by the same mask at the same time. Alternatively, the channel layer may be patterned by a first mask, and the second conductive layer may be patterned by a second mask.

Figure 5A:
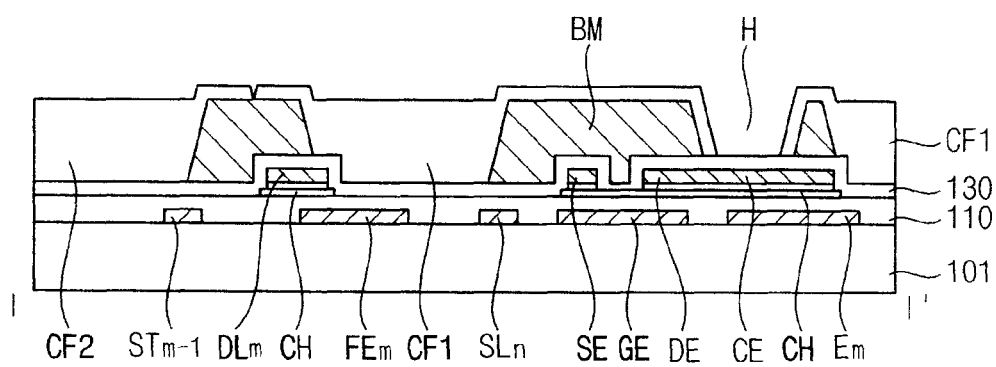
FIG. 5A and FIG. 5B are, respectively, a cross-sectional view and a plan view, depicting a method of forming a color filter layer of the display substrate of FIG. 2.
Figure 5B:
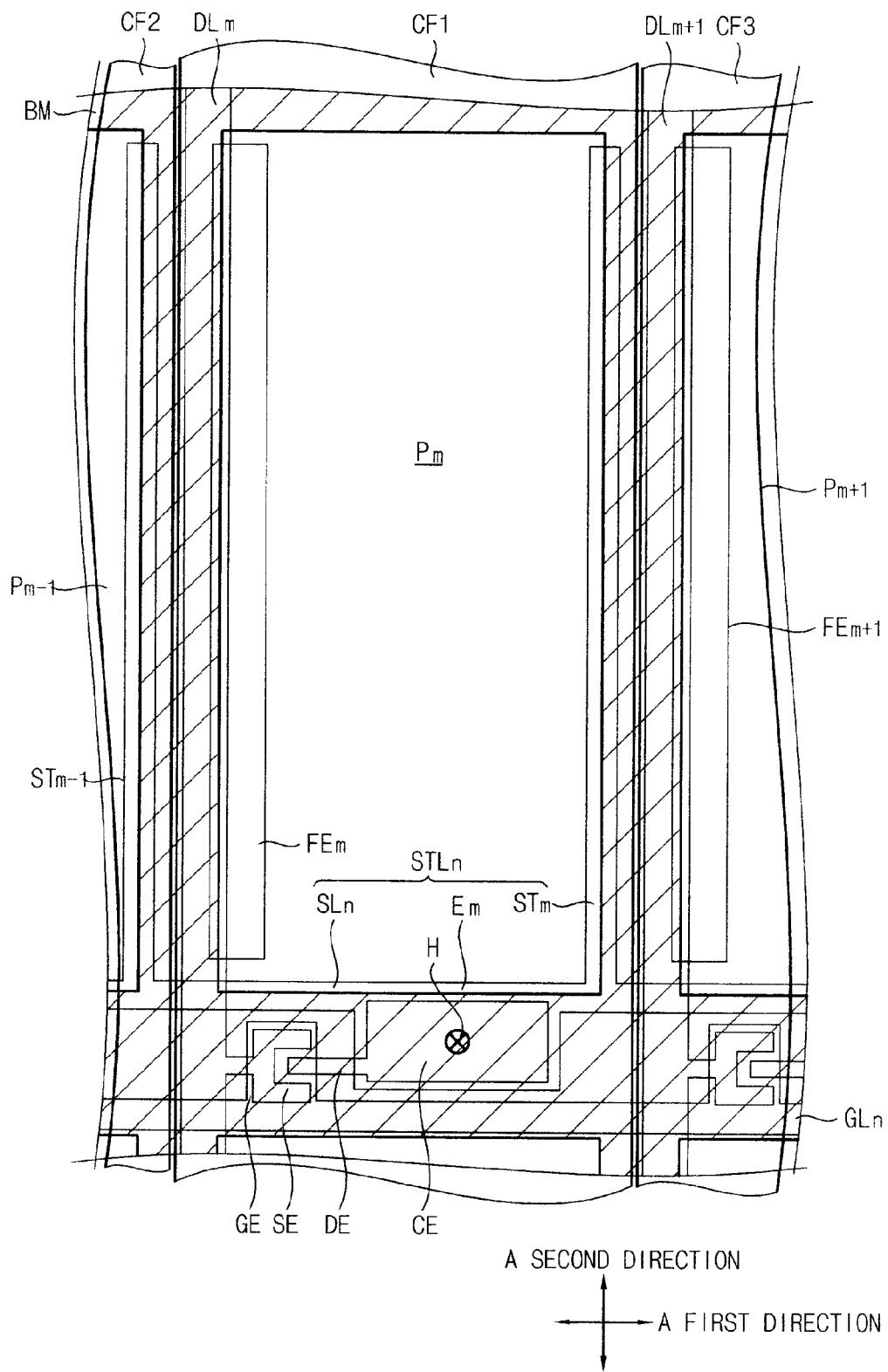

FIG. 5A and FIG. 5B are, respectively, a cross-sectional view and a plan view, depicting a method of forming a color filter layer of the display substrate of FIG. 2.

Referring to FIG. 2, FIG. 5A, and FIG. 5B, a light blocking layer is formed on a first substrate 101 on which the protection layer 130 is formed, and the light blocking layer is patterned to form the light blocking pattern BM.

The light blocking pattern BM is formed in an area where the n-th gate line GLn, the n-th storage electrode line STLn, the m-th data line DLm, the contact electrode CE, the (m+1)-th data line DLm+1, and the transistor TR are formed. The light blocking pattern BM may have a matrix shape throughout the area of the first substrate 101.

The light blocking pattern BM forms a color photoresist layer on the first substrate 101, and the color photoresist layer is patterned to form a color filter.

For example, a first color photoresist layer is formed on the first substrate 101 and the first color photoresist layer is patterned, so as to form a first color filter CF1 in a first area. A second color photoresist layer is formed on a first substrate 101 on which the first color filter CF1 is formed and the second color photoresist layer is patterned, so as to form a second color filter CF2 in a second area. A third color photoresist layer is formed on a first substrate 101 on which the first color filter CF1 and the second color filter CF2 are formed and the third color photoresist layer is patterned, so as to form a third color filter CF3 in a third area. The first area may be defined by the m-th data line DLm and the (m+1)-th data line DLm+1, the second area may be defined by the (m−1)-th data line (not shown) and the m-th data line DLm, and the third area may be defined by the (m+1)-th data line DLm+1 and the (m+2)-th data line (not shown).

Therefore, the first color filter CF1 is formed in an m-th pixel area Pm, the second color filter CF2 is formed in a (m−1)-th pixel area Pm−1, and the third color filter CF3 is formed in a (m+1)-th pixel area Pm+1.

An opening H, which exposes the protection layer 130, is formed through the light blocking pattern BM and the first color filter CF1, the second color filter CF2, and the third color filter CF3 on the contact electrode CE.

Thus, the color filter layer CFL is formed on the first substrate 101.

Figure 6A:
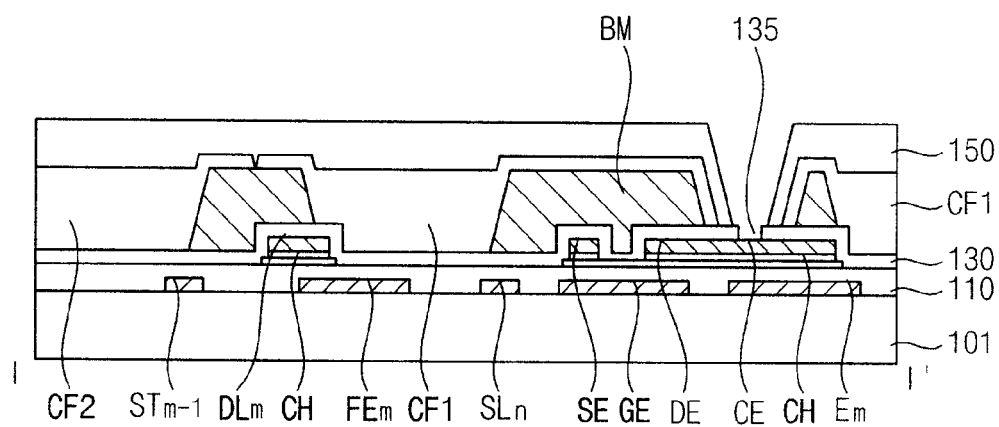
FIG. 6A and FIG. 6B are, respectively, a cross-sectional view and a plan view, depicting a method of forming a contact hole of the display substrate of FIG. 2.
Figure 6B:
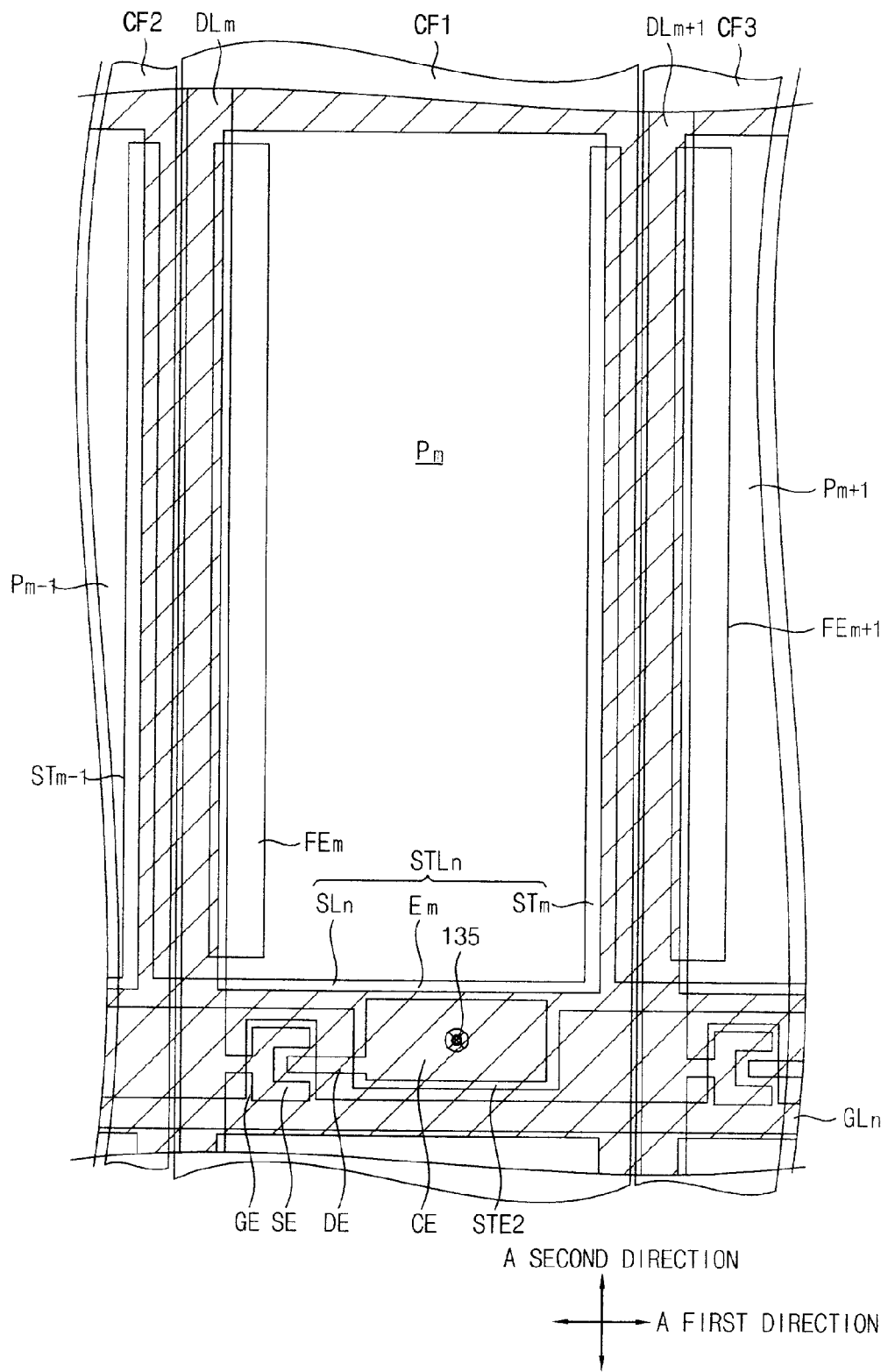

FIG. 6A and FIG. 6B are, respectively, a cross-sectional view and a plan view, depicting a method of forming a contact hole of the display substrate of FIG. 2.

Referring to FIG. 2, FIG. 6A, and FIG. 6B, an overcoating layer 150 is formed on a first substrate 101 on which color filter CF1, color filter CF2, and color filter CF3 are formed. The overcoating layer 150 may include an organic material or an inorganic material. Alternatively, the overcoating layer 150 may be made of multiple layers that include organic and inorganic materials. An opening H, which exposes the protection layer 130, is formed through the overcoating layer 150 on the contact electrode CE. The overcoating layer 150 may be omitted.

The protection layer 130 exposed by the opening H, which is exposed by an etching process on the first substrate 101 on which the color filter layer CFL is formed, is etched to form a contact hole 135. The contact electrode CE is exposed by the contact hole 135.

Figure 7A:
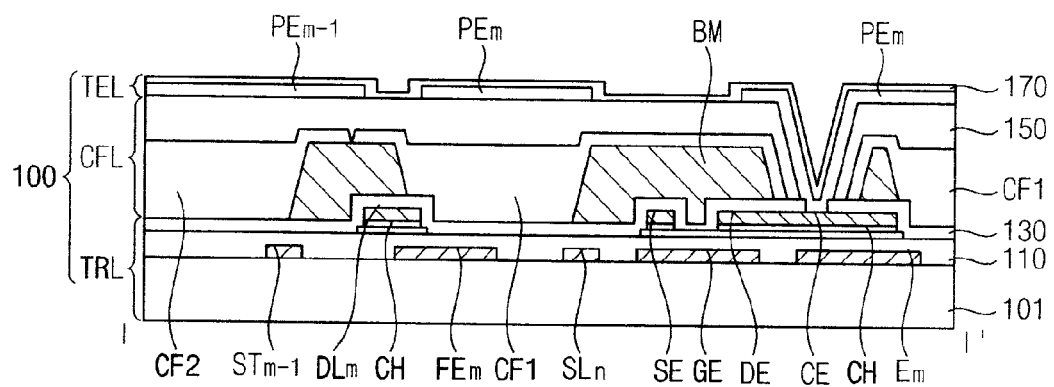
FIG. 7A and FIG. 7B are, respectively, a cross-sectional view and a plan view, depicting a method of forming a transparent electrode layer of the display substrate of FIG. 2.
Figure 7B:
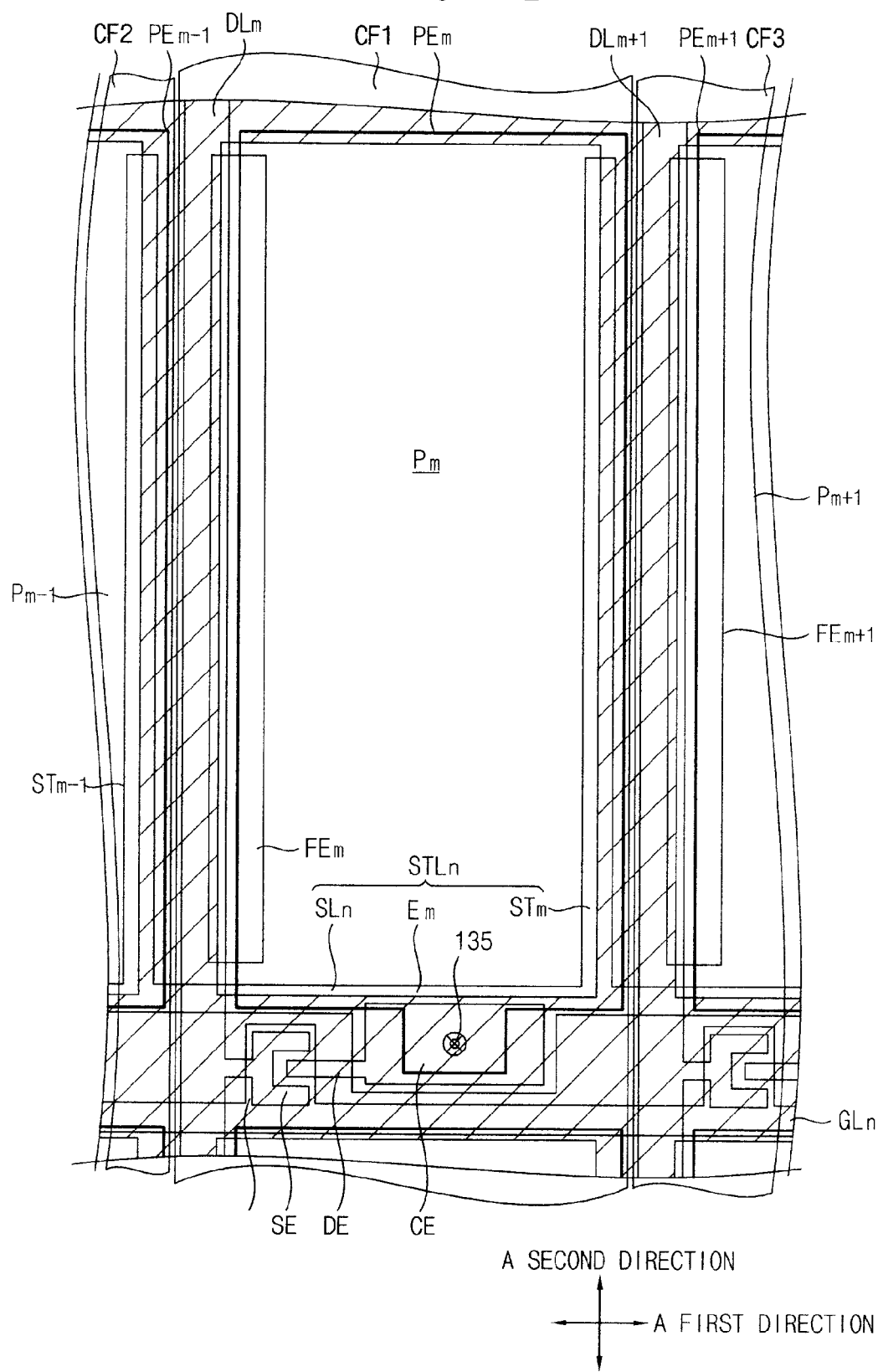

FIG. 7A and FIG. 7B are, respectively, a cross-sectional view and a plan view, depicting a method of forming a transparent electrode layer of the display substrate of FIG. 2.

Referring to FIG. 2, FIG. 7A, and FIG. 7B, a transparent conductive layer is formed on a first substrate 101 through which the contact hole 135 is formed, and the transparent conductive layer is patterned to form a plurality of pixel electrodes including the (m−1)-th pixel electrode PEm−1, the m-th pixel electrode PEm, and the (m+1)-th pixel electrode PEm+1.

For example, the m-th pixel electrode PEm is formed in the m-th pixel area Pm, the (m−1)-th pixel electrode PEm−1 is formed in the (m−1)-th pixel area Pm−1, and the (m+1)-th pixel electrode PEm+1 is formed in the (m+1)-th pixel area Pm+1. The m-th pixel electrode PEm overlaps with the m-th storage electrode STm in the m-th pixel area Pm. The m-th pixel electrode PEm makes contact with the contact electrode CE through the contact hole 135 and is electrically connected to a drain electrode DE of the transistor TR.

A storage capacitor in the m-th pixel area Pm may be defined in an area of the m-th pixel electrode PEm overlapping with the m-th storage electrode STm.

Figure 8A:
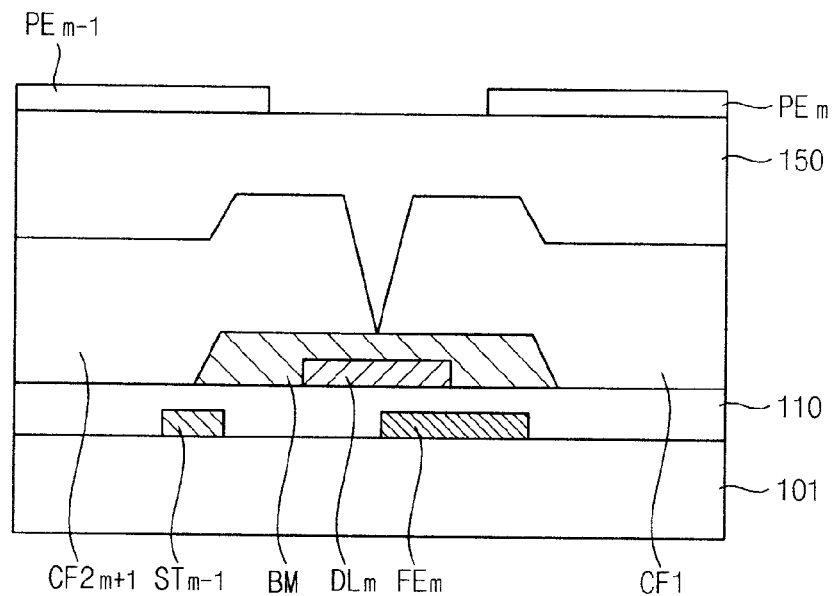
FIG. 8A and FIG. 8B are conceptual diagrams depicting a prevention of color shift and light leakage by the display substrate of FIG. 2.
Figure 8B:
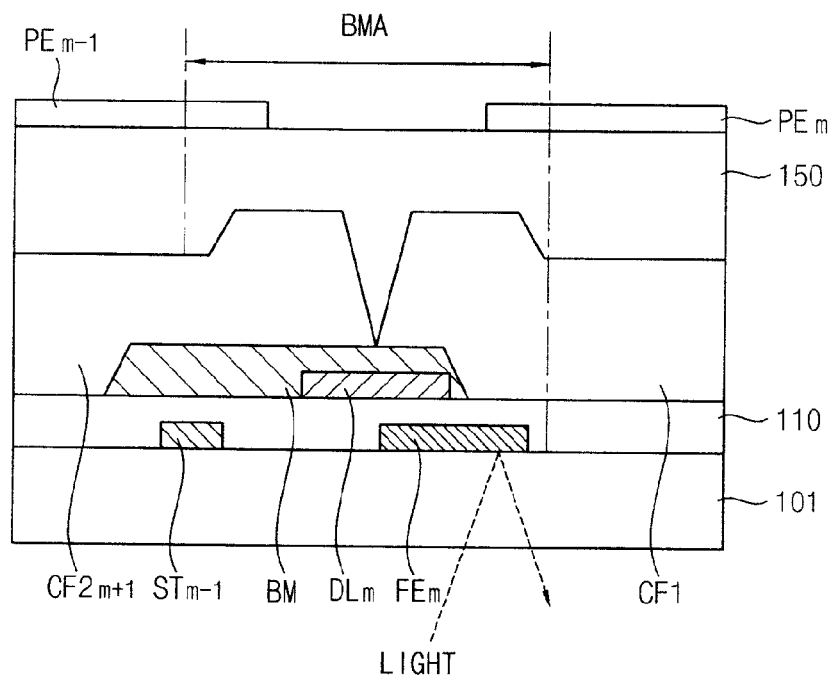

FIG. 8A and FIG. 8B are conceptual diagrams depicting a prevention of color shift light leakage by the display substrate of FIG. 2.

Referring to FIG. 2 and FIG. 8A, the (m−1)-th storage electrode STm−1 and an m-th floating electrode FEm are disposed at the sides of the m-th data line DLm. The (m−1)-th storage electrode STm−1 is spaced apart from the m-th data line DLm and disposed at a first side of the m-th data line DLm, and the m-th floating electrode FEm partially overlaps with the m-th data line DLm and is disposed at a second side of the m-th data line DLm. An m-th pixel electrode PEm is disposed to partially overlap with the m-th floating electrode FEm.

The m-th floating electrode FEm is electrically floated and overlaps with the m-th pixel electrode PEm. A potential level of the m-th floating electrode FEm may be changed according to that of the m-th pixel electrode PEm overlapping with the m-th floating electrode FEm.

The m-th floating electrode FEm is affected by the potential level of the m-th pixel electrode PEm formed in the m-th pixel area Pm, but is not affected by the potential level of the (m−1)-th pixel electrode PEm−1 formed in the (m−1)-th pixel area Pm−1 adjacent to the m-th floating electrode. Therefore, color shift due to coupling capacitance of a (m−1)-th pixel electrode PEm−1 adjacent to the m-th floating electrode may be prevented.

Referring to FIG. 8B, the (m−1)-th storage electrode STm−1 and an m-th floating electrode FEm are disposed at the sides of the m-th data line DLm. The (m−1)-th storage electrode STm−1 is spaced apart from the m-th data line DLm and disposed at a first side of the m-th data line DLm, and the m-th floating electrode FEm partially overlaps with the m-th data line DLm and is disposed at a second side of the m-th data line DLm.

The light blocking pattern BM is not formed in a centered position BMA, but is formed in a shifted position that is shifted to a side of the centered position BMA in accordance with a process margin. In this case, the m-th floating electrode FEm partially overlapping with the m-th data line DLm is formed, and then the leaked light LIGHT from an area between the m-th data line DLm and the m-th pixel electrode PEm may be blocked. Therefore, the m-th floating electrode FEm may block a light leakage LIGHT according to a viewing angle.

According to the present exemplary embodiment, color shift may be decreased and light leakage may be prevented.

Hereinafter, the same reference numerals will be used to refer to the same or like parts as those described above, and thus any repetitive explanation will be omitted.

Figure 9:
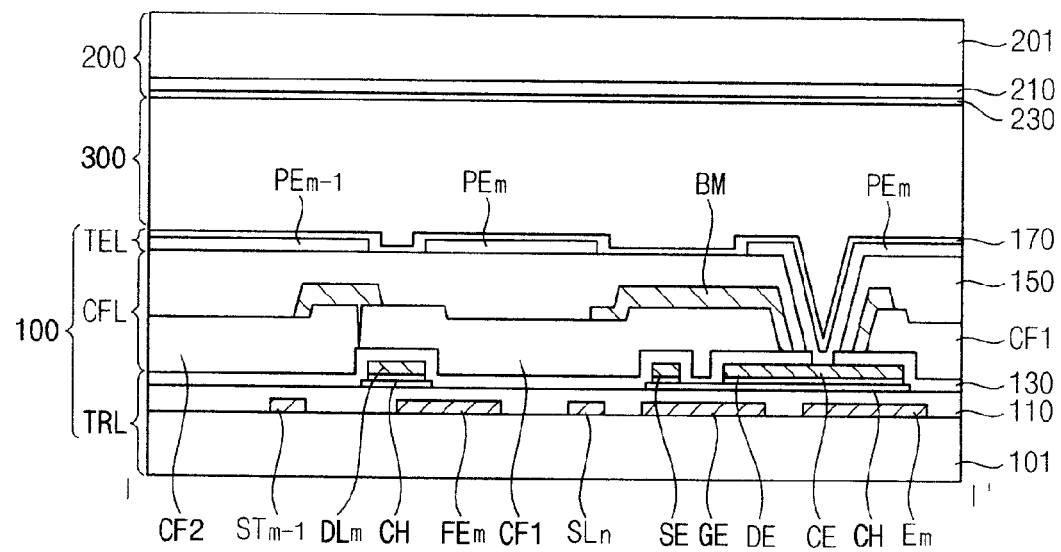
FIG. 9 is a cross-sectional view depicting a display apparatus according to an exemplary embodiment of the present invention.

FIG. 9 is a cross-sectional view depicting a display apparatus according to an exemplary embodiment of the present invention.

Referring to FIG. 1 and FIG. 9, a display apparatus 500B includes a display substrate 100, an opposite substrate 200 and a liquid crystal layer 300.

The display substrate 100 includes a first substrate 101, a transistor layer TRL, a color filter layer CFL and a transparent electrode layer TEL.

The transistor layer TRL includes a first conductive pattern, an insulating layer 110, a second conductive pattern and a protection layer 130.

The first conductive pattern includes an n-th gate line GLn, an n-th storage electrode line STLn and an m-th floating electrode FEm disposed on the first substrate 101.

The n-th storage electrode line STLn includes an n-th storage line SLn extending along the first direction, a plurality of storage electrodes connected to the n-th storage line SLn, and a plurality of protruding electrodes connected to the n-th storage line SLn. The n-th storage electrode line STLn receives a storage common voltage.

For example, an m-th storage electrode STm is connected to the n-th storage line SLn and disposed in an m-th pixel area Pm adjacent to and substantially parallel with a (m+1)-th data line DLm+1. An m-th protruding electrode Em is connected to the n-th storage line SLn and disposed in the m-th pixel area Pm adjacent to the gate electrode GE. The m-th storage electrode STm is a common electrode of a storage capacitor defined in the m-th pixel area Pm, and additionally may block the light leaked to an area adjacent to the (m+1)-th data line DLm+1.

The m-th floating electrode FEm is partially overlapped by the m-th data line DLm and disposed to be substantially parallel with the m-th data line DLm. The m-th floating electrode FEm is electrically floated and may block the light leaked to an area adjacent to the m-th data line DLm. A width of the m-th floating electrode FEm may be larger than that of the m-th storage electrode STm.

The insulating layer 110 is disposed on the first substrate 101 on which the first conductive pattern is disposed, so as to cover the first conductive pattern.

The second conductive pattern includes the m-th data line DLm, a contact electrode CE and a (m+1)-th data line DLm+1.

The m-th data line DLm extends along a second direction crossing the first direction and includes a plurality of source electrodes. For example, the m-th data line DLm is spaced apart from the (m−1)-th storage electrode STm−1 and is disposed in an area partially overlapping with the m-th floating electrode FEm. The m-th data line DLm may include a source electrode SE disposed in the m-th pixel area Pm. The contact electrode CE is disposed in an area where the m-th protruding electrode Em is disposed, and overlaps with the m-th protruding electrode Em. The contact electrode CE includes a drain electrode DE disposed in an area spaced apart from the source electrode SE.

The protection layer 130 is disposed to cover the second conductive pattern on the first substrate 101 on which the second conductive pattern is disposed.

The color filter layer CFL includes a light blocking pattern BM, a plurality of color filters, including first color filter CF1, second color filter CF2, and third color filter CF3, and an overcoating layer 150. The color filter layer CFL may omit an overcoating layer 150.

The first color filter CF1, second color filter CF2, and third color filter CF3 are each disposed in an area between adjacent data lines. For example, a first color filter CF1 is disposed in an area between the m-th data line DLm and the (m+1)-th data line DLm+1, a second color filter CF2 is disposed in an area between the m-th data line DLm and the (m−1)-th data line (not shown), and a third color filter CF3 is disposed in an area between the (m+1)-th data line DLm+1 and the (m+2)-th data line (not shown). Therefore, the first color filter CF1 may be disposed in the m-th pixel area Pm, the second color filter CF2 may be disposed in a (m−1)-th pixel area Pm−1, and the third color filter CF3 may be disposed in a (m+1)-th pixel area Pm+1.

The light blocking pattern BM may be disposed in an area where the first and second conductive patterns are disposed. For example, the light blocking pattern BM is disposed corresponding to an area where the n-th gate line GLn, the n-th storage electrode line STLn, the m-th data line DLm, the contact electrode CE and the (m+1)-th data line DLm+1 are disposed.

The transparent electrode layer TEL includes a plurality of pixel electrodes and a first alignment layer 170. An m-th pixel electrode PEm may be disposed in the m-th pixel area Pm corresponding to the n-th gate line GLn, an m-th data line DLm and a (m+1)-th data line DLm+1. A (m−1)-th pixel electrode PEm−1 may be disposed in the (m−1)-th pixel area Pm−1 corresponding to the n-th gate line GLn, a (m−1)-th data line (not shown) and an m-th data line DLm. A (m+1)-th pixel electrode PEm+1 may be disposed in a (m+1)-th pixel area Pm+1 corresponding to the n-th gate line GLn, the (m+1)-th data line DLm+1 and the (m+2)-th data line (not shown).

The first alignment layer 170 is disposed on the first substrate 101 on which the (m−1)-th pixel electrode PEm−1, the m-th pixel electrode PEm, and the (m+1)-th pixel electrode PEm+1 are disposed.

FIG. 10A, FIG. 10B, FIG. 10C, and FIG. 10D are cross-sectional views depicting a method of manufacturing the display substrate of FIG. 9.

Figure 10A:
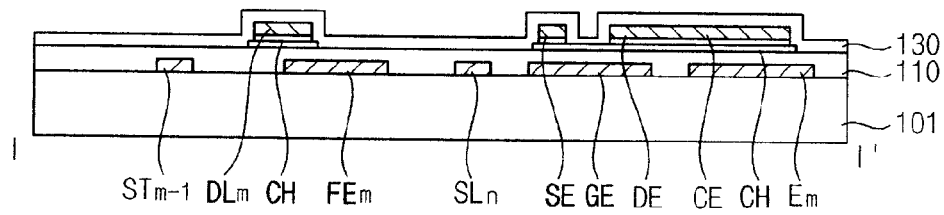
FIG. 10A, FIG. 10B, FIG. 10C, and FIG. 10D are cross-sectional views depicting a method of manufacturing the display substrate of FIG. 9.

Referring to FIG. 9 and FIG. 10A, a first conductive layer is formed on the first substrate 101 and the first conductive layer is patterned to form a first conductive pattern. The first conductive pattern includes an n-th gate line GLn, an n-th storage electrode line STLn and an m-th floating electrode FEm. The n-th storage electrode line STLn includes an n-th storage line SLn extending along the first direction, an m-th storage electrode STm connected to the n-th storage line SLn and extending along a second direction crossing the first direction, and an m-th protruding electrode Em connected to the n-th storage line SLn and adjacent to the gate electrode GE. The m-th floating electrode FEm is spaced apart from the m-th storage electrode STm.

The insulating layer 110 is formed on the first substrate 101 on which the first conductive pattern is formed.

A channel layer and a second conductive layer are formed on the insulating layer 110. The channel layer may include a semiconductor layer and an ohmic contact layer. The channel layer and the second conductive layer are pattered using the same mask at the same time, so as to form a second conductive pattern.

The second conductive pattern has a double layer structure including the second conductive layer and the channel layer, and includes an m-th data line DLm, a contact electrode CE and a (m+1)-th data line DLm+1. Each of the m-th data line DLm, the contact electrode CE, and the (m+1)-th data line DLm+1 includes the channel pattern CH. The m-th data line DLm is spaced apart from the m-th storage electrode STm and is formed in an area partially overlapping with the m-th floating electrode FEm. Therefore, the m-th floating electrode FEm may block the light leaked from an area adjacent to the m-th data line DLm.

The protection layer 130 is formed on the first substrate 101 on which the second conductive pattern is formed. The protection layer 130 may include an organic material or an inorganic material. Alternatively, the protection layer 130 may be made of multiple layers that include organic and inorganic materials. Therefore, the transistor layer TRL is formed on the first substrate 101.

Figure 10B:
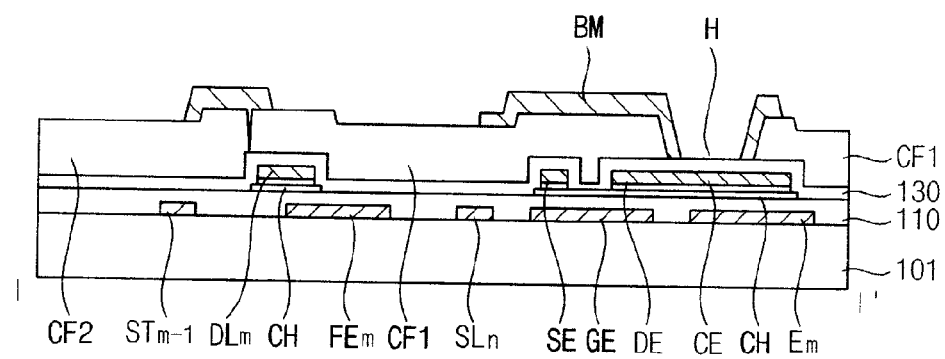

Referring to FIG. 9 and FIG. 10B, a color photoresist layer is formed on the first substrate 101 on which the protection layer 130 is formed, and the color photoresist layer is patterned to form a color filter.

For example, a first color photoresist layer is formed on the first substrate 101 and the first color photoresist layer is patterned, so as to form a first color filter CF1 in a first area. A second color photoresist layer is formed on a first substrate 101 on which the first color filter CF1 is formed and the second color photoresist layer is patterned, so as to form a second color filter CF2 in a second area. A third color photoresist layer is formed on a first substrate 101 on which the first color filter CF1 and the second color filter CF2 are formed and the third color photoresist layer is patterned, so as to form a third color filter CF3 in a third area. The first area may be defined by the m-th data line DLm and the (m+1)-th data line DLm+1, the second area may be defined by the (m−1)-th data line (not shown) and the m-th data line DLm, and the third area may be defined by the (m+1)-th data line DLm+1 and the (m+2)-th data line (not shown).

Therefore, the first color filter CF1 is formed in an m-th pixel area Pm, the second color filter CF2 is formed in a (m−1)-th pixel area Pm−1, and the third color filter CF3 is formed in a (m+1)-th pixel area Pm+1.

A light blocking layer is formed on a first substrate 101 on which the first color filter CF1, the second color filter CF2, and the third color filter CF3 are formed, and the light blocking layer is patterned to form the light blocking pattern BM. The light blocking pattern BM is formed in an area where the n-th gate line GLn, the n-th storage electrode line STLn, the m-th data line DLm, the contact electrode CE, the (m+1)-th data line DLm+1, and the transistor TR are formed. The light blocking pattern BM may have a matrix shape throughout the area of the first substrate 101.

An opening H, which exposes the protection layer 130, is formed through the light blocking pattern BM and the first color filter CF1, the second color filter CF2, and third color filter CF3 on the contact electrode CE.

Figure 10C:
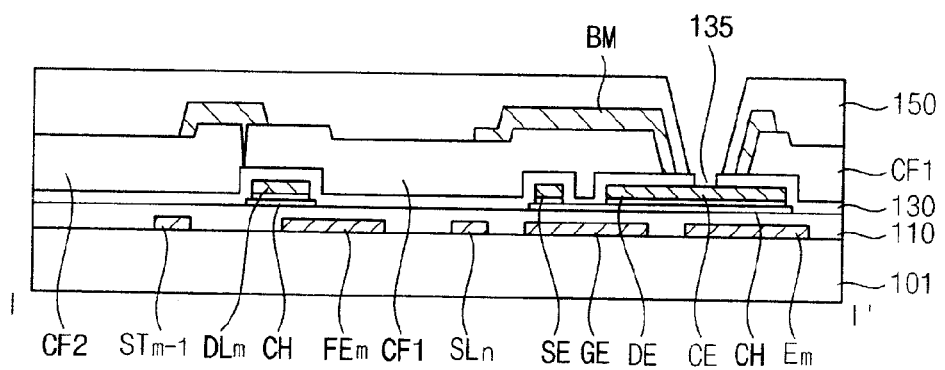

Referring to FIG. 9 and FIG. 10C, an overcoating layer 150 is formed on a first substrate 101 on which the first color filter CF1, the second color filter CF2, and the third color filter CF3 are formed. The overcoating layer 150 may include an organic material or an inorganic material. Alternatively, the overcoating layer 150 may be made of multiple layers that include organic and inorganic materials. An opening H1, which exposes the protection layer 130, is formed through the overcoating layer 150 on the contact electrode CE. The protection layer 130 exposed by the opening H1, which is exposed by an etching process on the first substrate 101 on which the color filter layer CFL is formed, is etched to form a contact hole 135.

Figure 10D:
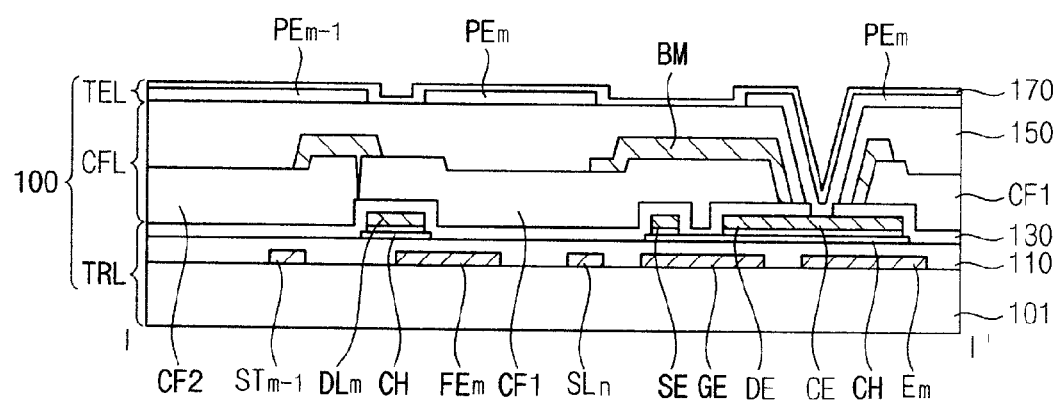

Referring to FIG. 9 and FIG. 10D, a transparent conductive layer is formed on a first substrate 101 having the contact hole 135 and the transparent conductive layer is patterned to form a plurality of pixel electrodes including the (m−1)-th pixel electrode PEm−1, the m-th pixel electrode PEm, and the (m+1)-th pixel electrode PEm+1. For example, the m-th pixel electrode PEm overlaps with the m-th storage electrode STm in the m-th pixel area Pm. The m-th pixel electrode PEm makes contact with the contact electrode CE through the contact hole 135 and is electrically connected to a drain electrode DE of the transistor TR.

According to an exemplary embodiment of the present invention, a first side of a data line is spaced apart from a storage electrode receiving common voltage and a second side of the data line partially overlaps with a floating electrode so that color shift may be decreased and light leakage may be prevented.

The foregoing exemplary embodiments of the present invention are not to be construed as limiting the present invention. Although a few exemplary embodiments of the present invention have been described, those skilled in the art will readily appreciate that many modifications to the exemplary embodiments are possible without materially departing from the teachings and advantages of the present invention. Accordingly, all such modifications are included within the scope of the present invention. Therefore, it is to be understood that the foregoing is illustrative of the present invention and the present invention is not to be construed as limited to the specific exemplary embodiments disclosed, and that modifications to the disclosed exemplary embodiments, as well as other embodiments, are included within the scope of the invention.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A display substrate, comprising:
   a pixel electrode disposed in a pixel area on a substrate;
   a first data line disposed at a first side of the pixel electrode and electrically connected to the pixel electrode;
   a first floating electrode partially overlapped by the first data line;
   a second data line disposed at a second side of the pixel electrode;
   a second floating electrode partially overlapped by the second data line; and
   a storage electrode overlapping the pixel electrode, spaced apart from the second data line, and substantially parallel to the second data line,
   wherein the first floating electrode is electrically separate from the second floating electrode.

2. The display substrate of claim 1, wherein the first floating electrode and the second floating electrode are electrically floated, and the storage electrode is configured to receive voltage.

3. The display substrate of claim 1, further comprising:
   a first gate line crossing the first data line and the second data line;
   a storage line disposed in parallel with the first gate line and electrically connected to the storage electrode; and
   a transistor electrically connected to the first data line and the first gate line.

4. The display substrate of claim 3, further comprising:
   a color filter layer disposed on the substrate and covering the transistor.

5. The display substrate of claim 4, wherein the color filter layer comprises:
   a light blocking pattern covering the first data line and the second data line; and
   a color filter disposed in the pixel area between the pixel electrode and the substrate.

6. The display substrate of claim 5, further comprising:
   an overcoating layer disposed on the substrate between the color filter and the pixel electrode and covering the light blocking pattern and the color filter.

7. The display substrate of claim 3, further comprising:
   a contact electrode to electrically connect the pixel electrode to the transistor; and
   a protruding electrode electrically connected to the storage line and overlapped by the contact electrode.

8. The display substrate of claim 1, further comprising:
   a light blocking pattern at least partially overlapping the first floating electrode, the second floating electrode, and the storage electrode.

9. A method for manufacturing a display substrate, the method comprising:
   forming a first conductive pattern in a pixel area on a substrate, the first conductive pattern comprising a first floating electrode and a storage electrode;
   forming a second floating electrode on the substrate, the second floating electrode being electrically separate from the first floating electrode;
   forming a second conductive pattern on the substrate comprising the first conductive pattern, the second conductive pattern further comprising:
      a first data line partially overlapping the first floating electrode, and
      a second data line spaced apart from and substantially parallel to the storage electrode and partially overlapping the second floating electrode; and
   forming a pixel electrode in the pixel area on the substrate comprising the second conductive pattern, the pixel electrode being electrically connected to the first data line.

10. The method of claim 9, wherein forming the first conductive pattern further comprises:
    forming a first gate line crossing the first data line, the second data line, and a storage line parallel to the first gate line, and
    wherein the storage line is electrically connected to the storage electrode.

11. The method of claim 9, further comprising:
    forming a transistor electrically connected to the first gate line and the first data line.

12. The method of claim 11, further comprising:
    forming a contact electrode to electrically connect the pixel electrode to the transistor; and
    a protruding electrode electrically connected to the storage line and overlapped by the contact electrode.

13. The method of claim 11, further comprising:
    forming a color filter layer on the substrate.

14. The method of claim 13, wherein forming the color filter layer comprises:
    forming a light blocking pattern covering the first data line and the second data line; and
    forming a color filter in the pixel area.

15. The method of claim 14, further comprising:
    forming an overcoating layer on the substrate.

16. The method of claim 9, further comprising:
    forming a light blocking pattern at least partially overlapping the first floating electrode, the second floating electrode, and the storage electrode.

17. A display apparatus, comprising:
    a display substrate, comprising:
       a pixel electrode disposed in a pixel area on a substrate,
       a first data line disposed at a first side of the pixel electrode and electrically connected to the pixel electrode,
       a first floating electrode partially overlapped by the first data line, the first floating electrode being electrically floated,
       a second data line disposed at a second side of the pixel electrode, a second floating electrode partially overlapped by the second data line, wherein the second floating electrode is electrically floated and is electrically separate from the first floating electrode, and a storage electrode overlapping the pixel electrode and spaced apart from the second data line, wherein the storage electrode is substantially parallel to the second data line and configured to receive voltage; and an opposite substrate facing the display substrate and comprising a common electrode.

18. The display apparatus of claim 17, wherein the display substrate further comprises:

a first gate line crossing the first data line and the second data line;

a storage line disposed in parallel with the first gate line and electrically connected to the storage electrode; and a transistor electrically connected to the first data line and the first gate line.

19. The display apparatus of claim 18, wherein the display substrate further comprises:

a color filter layer disposed on the substrate and covering the transistor.

20. The display apparatus of claim 19, wherein the color filter layer comprises:

a light blocking pattern covering the first data line and the second data line; and a color filter disposed in the pixel area between the pixel electrode and the display substrate.

21. The display apparatus of claim 20, wherein the display substrate further comprises:

an overcoating layer disposed on the display substrate between the color filter and the pixel electrode and covering the light blocking pattern and the color filter.

22. The display apparatus of claim 18, wherein the display substrate further comprises:

a contact electrode to electrically connect the pixel electrode to the transistor; and a protruding electrode electrically connected to the storage line and overlapped by the contact electrode.

23. The display apparatus of claim 17, wherein the display substrate further comprises:

a light blocking pattern at least partially overlapping the first floating electrode, the second floating electrode, and the storage electrode.

* * * * *